US009865330B2

United States Patent
Jung et al.

(10) Patent No.: US 9,865,330 B2
(45) Date of Patent: Jan. 9, 2018

(54) STABLE SRAM BITCELL DESIGN UTILIZING INDEPENDENT GATE FINFET

(75) Inventors: Seong-Ook Jung, Gyeonggi-do (KR); Mingu Kang, Gyeonggi-do (KR); Hyunkook Park, Anyang (KR); Seung-Chul Song, Dallas, TX (US); Mohamed Abu-Rahma, San Diego, CA (US); Beom-Mo Han, San Diego, CA (US); Lixin Ge, San Diego, CA (US); Zhongze Wang, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 223 days.

(21) Appl. No.: 12/939,260

(22) Filed: Nov. 4, 2010

(65) Prior Publication Data

US 2012/0113708 A1    May 10, 2012

(51) Int. Cl.
  *G11C 11/412* (2006.01)
  *H01L 27/11* (2006.01)
(52) U.S. Cl.
  CPC ...... *G11C 11/4125* (2013.01); *H01L 27/1104* (2013.01); *Y10T 29/49117* (2015.01)
(58) Field of Classification Search
  CPC ............. G11C 11/4125; H01L 27/1104; Y10T 29/49117
  (Continued)

(56) References Cited

U.S. PATENT DOCUMENTS 5,559,745 A    9/1996  Banik et al.
6,639,827 B2 * 10/2003 Clark et al. ............ 365/154
(Continued)

FOREIGN PATENT DOCUMENTS

CN    1893079 A    1/2007
CN   101345240 A    1/2009
(Continued)

OTHER PUBLICATIONS

Thomas et al., Patent Application Publication 2001/0315889 A1 (U.S. Appl. No. 12/866,821).*
(Continued)

*Primary Examiner* — Vu Le
*Assistant Examiner* — Sung Cho
(74) *Attorney, Agent, or Firm* — Withrow & Terranova, PLLC

(57) ABSTRACT

Stable SRAM cells utilizing Independent Gate FinFET architectures provide improvements over conventional SRAM cells in device parameters such as Read Static Noise Margin (RSNM) and Write Noise Margin (WNM). Exemplary SRAM cells comprise a pair of storage nodes, a pair of bit lines, a pair of pull-up devices, a pair of pull-down devices and a pair of pass-gate devices. A first control signal and a second control signal are configured to adjust drive strengths of the pass-gate devices, and a third control signal is configured to adjust drive strengths of the pull-up devices, wherein the first control signal is routed orthogonal to a bit line direction, and the second and third control signals are routed in a direction same as the bit line direction. RSNM and WNM are improved by adjusting drive strengths of the pull-up and pass-gate devices during read and write operations.

32 Claims, 12 Drawing Sheets

(58) Field of Classification Search
USPC .......................................... 365/94, 154, 156
See application file for complete search history.

(56) References Cited

U.S. PATENT DOCUMENTS

| | | | |
|---|---|---|---|
| 7,336,533 B2 | 2/2008 | Hunter et al. | |
| 7,400,525 B1* | 7/2008 | Kim | G11C 11/412 365/156 |
| 7,403,410 B2* | 7/2008 | Burnett | 365/154 |
| 7,511,989 B2* | 3/2009 | Thomas | H01L 27/1104 257/369 |
| 7,522,445 B2* | 4/2009 | Inaba | G11C 11/412 365/104 |
| 7,532,501 B2* | 5/2009 | Joshi et al. | 365/154 |
| 7,681,628 B2* | 3/2010 | Joshi et al. | 165/154 |
| 7,710,765 B2* | 5/2010 | Hanafi | 365/156 |
| 7,729,159 B2* | 6/2010 | Braceras et al. | 365/154 |
| 7,751,270 B2* | 7/2010 | Geens et al. | 365/229 |
| 7,787,286 B2* | 8/2010 | Thomas | G11C 11/413 365/154 |
| 7,990,757 B2* | 8/2011 | Kim | 365/154 |
| 8,009,463 B2* | 8/2011 | Liaw | 365/154 |
| 8,040,717 B2* | 10/2011 | Ouchi | H01L 21/845 365/154 |
| 8,169,814 B2* | 5/2012 | Chuang et al. | 365/154 |
| 2005/0073874 A1* | 4/2005 | Chan | G11C 11/412 365/154 |
| 2006/0274569 A1* | 12/2006 | Joshi | H01L 27/1104 365/154 |
| 2007/0030741 A1* | 2/2007 | Nii | G11C 5/06 365/189.11 |
| 2007/0076467 A1 | 4/2007 | Yamaoka et al. | |
| 2007/0242497 A1* | 10/2007 | Joshi | G11C 11/412 365/154 |
| 2008/0203443 A1* | 8/2008 | Wilson | G11C 11/22 257/260 |
| 2008/0273366 A1* | 11/2008 | Braceras | G11C 11/412 365/63 |
| 2009/0073746 A1* | 3/2009 | Ng | G11C 11/412 365/154 |
| 2009/0086528 A1* | 4/2009 | Hanafi | G11C 11/412 365/156 |
| 2010/0165707 A1* | 7/2010 | Chen | G11C 11/412 365/156 |
| 2010/0195366 A1* | 8/2010 | Chen | G11C 17/18 365/94 |
| 2010/0315862 A1* | 12/2010 | Huang | G11C 11/419 365/156 |
| 2010/0315889 A1* | 12/2010 | Thomas | G11C 11/412 365/189.011 |
| 2010/0328990 A1 | 12/2010 | Ouchi et al. | |
| 2011/0103137 A1* | 5/2011 | Beat | G11C 11/412 365/156 |

FOREIGN PATENT DOCUMENTS

| | | |
|---|---|---|
| CN | 101770805 A | 7/2010 |
| JP | H11126485 A | 5/1999 |
| JP | 2002045093 A | 2/2002 |
| JP | 2003016786 A | 1/2003 |
| JP | 2007103629 A | 4/2007 |
| JP | 2007193928 A | 8/2007 |
| JP | 2007201107 A | 8/2007 |
| JP | 2008069277 A | 3/2008 |
| JP | 2008114716 A | 5/2008 |
| JP | 2008527603 A | 7/2008 |
| JP | 2009534783 A | 9/2009 |
| JP | 2010187020 A | 8/2010 |
| JP | 2011070728 A | 4/2011 |
| JP | 2011512609 A | 4/2011 |
| WO | 2008069277 A | 6/2008 |

OTHER PUBLICATIONS

Endo et al., "Independent-gate four-terminal FinFET SRAM for drastic leakage current reduction", IEEE International Conference on Integrated Circuit Design and Technology and Tutorial (ICICDT), Jun. 2, 2008, pp. 63-66, IEEE, XP031287506, ISBN: 978-1-4244-1810-7.

International Search Report and Written Opinion—PCT/US2011/059247—ISA/EPO—dated Feb. 21, 2012.

O'Uchi et al., "FinFET-Based Flex-Vth SRAM Design For Drastic Standby-Leakage-Current Reduction", IEICE Transactions on Electronics, Apr. 1, 2008, pp. 534-542, vol. E91C, No. 4, Institute of Electronics, XP001513893, ISSN: 0916-8524, DOI: 10.1093/IETELE/E91-C.4.534.

* cited by examiner

Conventional 6T SRAM

CONVENTIONAL TIED GATE SRAM

<Write operation>

| | Standby mode | | Read mode | | Write mode | | |
|---|---|---|---|---|---|---|---|
| | Cell 50 (RW/W/SW) | Liu (RW/W) | Cell 50 (RW/W/SW) | Liu (RW/W) | Cell 50 (RW/W/SW) | | Liu (RW/W) |
| Selected Cell (SLC: Cell 60) | | | RSNM (1/0/0) | RSNM1 (1/0) | WNM (1/1/1) | | WNM (1/1) |
| Horizontally selected, Vertically Half selected Cell (HSLC1: Cell 62) | HSNM1 (0/0/1) | HSNM (0/0) | HSNM2 (0/0/0) | HSNM (0/0) | RSNM (1/0/0) | | RSNM2 (1/1) |
| Vertically selected, Horizontally Half selected Cell (HSLC2: Cell 64) | | | | | HSNM3 (0/1/1) | | HSNM (0/0) |
| Unselected Cell (USLC) | | | | | HSNM2 (0/0/0) | | |

FIG. 10

STABLE SRAM BITCELL DESIGN UTILIZING INDEPENDENT GATE FINFET

FIELD OF DISCLOSURE

Disclosed embodiments are directed to Static Random Access Memory (SRAM) bit cells. More particularly, exemplary embodiments are directed to highly stable SRAM cells, utilizing Independent Gate FinFET (IG-FinFET) architectures.

BACKGROUND

SRAM is commonly used in applications where speed and low power are considerations. SRAM cells are fast and do not need to be dynamically updated, as in the case of Dynamic Random Access Memory (DRAM) cells. The structure of a conventional SRAM cell comprises two cross-coupled inverters, commonly formed from four Complementary Metal Oxide Semiconductor Field-Effect Transistors (Complementary MOSFET or CMOS transistors). The cross-coupled inverters form the basic storage element, with two stable states which represent the complementary binary values "0" and "1". Two additional transistors, called "access transistors", serve to control access to the storage element during read and write operations. Accordingly, a conventional SRAM cell architecture involves six transistors, and is generally referred to as a 6T SRAM cell.

FIG. 1 illustrates a conventional 6T SRAM cell 100. The storage element comprises transistors M1-M4. Nodes Q and QC hold complementary binary values. A write operation on cell 100 is initiating by driving word line WL to positive power supply voltage VDD. Access transistors M5 and M6 convey the values on complementary bit lines BL and BLC into the storage element. In a read operation, BL and BLC are both pre-charged to a predefined value, or left floating. Once the word line is activated, the complementary values stored in the storage element act to discharge one of the bit lines. Sense amplifiers (not shown) quickly drive the values on the discharged bit line to negative power supply voltage VSS and the complementary bit line to VDD accordingly.

With shrinking device sizes, MOSFETs employed in conventional SRAM architectures suffer from short-channel effects such as increased subthreshold leakage currents. Further, as supply voltage and threshold voltages are lowered to keep power consumption low, the stability of data stored in the SRAM cell is affected. In order to combat the drawbacks of conventional MOSFET structures, Multigate Field Effect Transistors (MuGFETs) have been explored in the past. A MuGFET incorporates more than one gate in a single device, such that multiple gates may be controlled by a single gate electrode. The channel in such a multigate device is surrounded by several gates, leading to a suppression of leakage currents, and corresponding decrease in power consumption. While conventional MOSFETs are planar, the multigate devices are non-planar structures.

A FinFET is a multigate device, wherein the channel is wrapped around a thin silicon "fin", which forms the body of the device (rather than a planar Si surface). The dimensions of the fin determine the effective channel length of the device. Short-channel effects are suppressed by making the fin very narrow. An independent-gate (IG) FinFET resembles two single-gate MOSFETs connected in parallel, sharing a common body.

Several parameters are relevant to studying the stability of SRAM cells. While these parameters will be initially explained with respect to the conventional SRAM cell of FIG. 1, they are easily extendable to IG-FinFET SRAM structures. Transistors M2 and M4 comprise a pull-up (PU) logic that enable the storage nodes Q and QC to be pulled up to positive supply voltage VDD. Similarly, transistors M1 and M3 comprise pull down (PD) logic to connect the nodes Q and QC to negative power supply voltage VSS (VSS may be connected to ground voltage). Access transistors M5 and M6 are also referred to as pass gate (PG) transistors. The relative strengths of PU, PD and PG components of an SRAM cell determine factors such as writability and data stability of the cell. In general, the strength of a transistor refers to the magnitude of current flowing through the device, and is proportional to the transistor size and gate voltage of the transistor.

Leakage currents, voltage perturbations, switching activity on neighboring cells and such other system noise have an effect on the stability of data in the SRAM cells. Sometimes the noise may be high enough to cause the data stored in a cell to "flip" to a false state, even if the particular cell is not selected for a read or write operation. The minimum DC-voltage disturbance required to upset or flip the state of a cell is known as the Static Noise Margin (SNM). Hold Static Noise Margin (HSNM) refers to the SNM of a cell in hold or standby mode. With reference to FIG. 1, increasing VDD-Cell voltage generally has the effect of increasing HSNM.

Parameter "$\alpha$" denotes the ratio of strengths of PG and PU (represented as "PG/PU"). It can be seen that decreasing the PU strength and increasing the PG strength allows the values on BL and BLC to be easily written into the storage nodes. Write static Noise Margin (WNM) refers to the SNM of a cell in write mode. Accordingly, the WNM of an SRAM circuit varies in proportion with $\alpha$. As indicated by $\alpha(=PG/PU)$ the WNM can be improved by increasing PG and/or decreasing PU.

Parameter "$\beta$" denotes the ratio of strengths of PD and PG (represented as "PD/PG"). It can be seen that decreasing the PG strength and increasing the PD strength allows the values on Q and QC to be easily read into the bit lines. Read Static Noise Margin (RSNM) refers to the SNM of a cell in read mode. The RSNM of an SRAM circuit varies in proportion with $\beta$. As indicated by $\beta(=PD/PG)$, the RSNM can be improved by increasing PD and/or decreasing PG.

From the foregoing discussion, it will be understood that varying the strengths of the PU, PD and PG components involves a complex tradeoff between the HSNM, RSNM and WNM of the cell. FIG. 2A illustrates a conventional tied-gate SRAM (TG-SRAM) cell including a pair of bit lines denoted "bitline" and "bitline_b" and a word line denoted "wordline." TG-SRAM cells have the basic structure of a dual-gate SRAM (DG-SRAM) cell. Both gates in the dual-gate of each transistor in TG-SRAM are tied together and thus the operation of a TG-SRAM cell is similar to that of a conventional 6T SRAM in FIG. 1.

A technique to increase cell stability by a feedback mechanism to back gates of the PG devices is proposed in Guo et al., "FinFET-Based SRAM Design", *Symp. ISLPED*, 2005, pp 2-7 (hereinafter, "Guo"), which is incorporated herein by reference. Guo utilizes a FinFET based SRAM cell that includes a pair of bit lines denoted "bitline" and "bitline_b" and a word line denoted "wordline" in order to gain better control over the gates and lower subthreshold leakage currents as noted above. Guo attempts to improve the cell $\beta$ ratio by controlling the back gate of the PG devices. The back gates of the PG devices are controlled by connecting the storage nodes to the back gates, as illustrated in FIG. 2B, in order to improve RSNM. However, connecting the storage nodes to the back gates deteriorates WNM by reducing the cell α ratio. In order to improve the WNM, Guo proposes lowering the voltage, VDD-Cell.

FIG. 3 illustrates a schematic of an SRAM array formed by cells according to Guo. Bit lines BL and BLB are shown to be disposed in a vertical direction in FIG. 3, while the word lines WL are disposed in a horizontal direction. The VDD-Cell of the cells, selected cell 31, connected to the "selected" BL and BLB (i.e. BL=1, BLB=0, and WL=1) is lowered during the write operation, thereby reducing the PU drive strength. As a result, the α ratio (PG/PU) of the selected cell is improved.

However, VDD-Cell of the half selected cell 32 (horizontally selected and vertically unselected, i.e. WL=1, BL and BLB=floating voltage of value 1 or "f1") in FIG. 3 is also reduced, which has the effect of lowering HSNM fir the half selected cell 32. Therefore, while Guo attempts to improve WNM of the SRAM cell, the HSNM deteriorates. Accordingly, there are two drawbacks in the design of Guo. Firstly, controlling VDD-Cell is very hard, and is subject to a lot of variation in the SRAM array. Secondly, lowering VDD-Cell has the effect of lowering HSNM, as noted above.

FIG. 7 illustrates butterfly transfer curves (BTC) for calculating a RSNM of conventional TG-SRAM cells (51.1 mV) and the RSNM of SRAM cells of Guo (136.5 mV). A BTC is a plot of the storage node voltage during a read operation, a write operation, or a standby mode. The SNM (e.g., the RSNM, the WNM, or the HSNM) is measured by the largest square that fits inside the BTC. As indicated by FIG. 7, the circuit of Guo offers an improvement in RSNM of 85.4 mv as compared to conventional TG-SRAM circuits. FIG. 8 similarly illustrates BTCs for calculating a WNM of the conventional TG-SRAM cells (338.5 mV) and the SRAM cells of Guo (372 mV). It can be observed that the circuit of Guo offers an improvement in WNM of 34.1 mv due to the lowering of VDD-Cell voltage. FIG. 9 illustrates BTCs for calculating an HSNM of the conventional TG-SRAM cells (324.5 mV) and for the SRAM cells of Guo (283.1 mV). It is observed that the HSNM of the SRAM cells of Guo is 41.4 mv lower than the HSNM of the conventional TG-SRAM cells.

An alternate scheme has been proposed to address the issues of conventional TG-SRAMs and Guo, in Liu et al., "An Independent-Gate FinFET SRAM Cell for High Data Stability and Enhanced Integration Density", *IEEE SOC Conference*, 2007, pp. 68-69, (hereinafter, "Liu"), which is incorporated herein by reference. The SRAM cell of Liu is illustrated in FIG. 4 and includes a pair of bit lines denoted "bitline" and "bitline_b." Liu utilizes a FinFET based structure, wherein each of the PU, PD and PG components utilize two transistors with independently controllable gates. This provides for improved control over their respective strengths.

Liu uses the control signals "RW" and "W", as shown in FIG. 4, to control read and write operations, instead of a conventional word line control signal (e.g., WL in FIG. 1). The Signal RW is held high during both read and write operations, while the signal W is high only during a write operation. Thus during a read, RW is high and W is low. Accordingly, during a read, PG1 and PG2 are conducting, but with the strength of only one of the two transistors (front transistor) in each pair, enabling PG to be maintained at a low value. PD and PU (i.e. PD1, PD2, PU1 and PU2) are maintained at a constant value, and therefore β(=PD/PG) is caused to increase, and RSNM of the cell is correspondingly high.

During a write operation in Liu, both RW and W are high, causing both transistors in each pair PG1 and PG2 to be conducting. It will be seen in this mode, that the relative strengths of the PU, PD and PG components of the cell are similar to that of a conventional SRAM, since each component in Liu is essentially replaced by a pair of transistors, as compared to a single transistor in conventional SRAMs. Therefore the ratio, α(=PG/PU) is comparable to that of a conventional TG-SRAM, and correspondingly, there is no improvement in the WNM of Liu. In a standby mode, both RW and W signals remain low, and thereby the HSNM of Liu is the same as that of a conventional TG-SRAM.

While the techniques provide improvements in one or two of these parameters, it is at the cost of either deterioration and/or lack of improvement in the remaining parameters. Therefore there is a need in the art for techniques to improve the SNM of SRAM circuits in read, write modes of operation without degrading the stability in standby mode of operation.

SUMMARY

Exemplary embodiments are directed to systems and method for highly stable SRAM cells, utilizing Independent Gate FinFET (IG-FinFET) architectures. Exemplary embodiments of the SRAM cells provide Improved stability over conventional SRAM cells as demonstrated by parameters such as RSNM and WNM without degrading HSNM.

For example, an exemplary embodiment is directed to an SRAM cell comprising a pair of storage nodes configured to store complementary binary values; a pair of bit lines configured to transmit the complementary binary values to/from the storage nodes; a pair of pull-up devices configured to couple the storage nodes to positive power supply voltage; a pair of pull-down devices configured to couple the storage nodes to negative power supply voltage; a pair of pass-gate devices configured to couple the storage nodes to the bit lines; a first control signal and a second control signal configured to adjust drive strengths of the pass-gate devices, wherein the first control signal is routed in a direction orthogonal to a bit line direction, and the second control signal is routed in a direction same as the bit line direction; and a third control signal to adjust drive strengths of the pull-up devices, wherein the third control signal is routed in a direction same as the bit line direction.

Another exemplary embodiment is directed to a method of forming an SRAM cell comprising configuring a pair of storage nodes to store complementary binary values; coupling a pair of bit lines to the storage nodes to transmit the complementary binary values to/from the storage nodes; coupling a pair of pull-up devices to the storage nodes in order to connect the storage nodes to positive power supply voltage; coupling a pair of pull-down devices to the storage nodes in order to connect the storage nodes to negative power supply voltage; coupling a pair of pass-gate devices to the storage nodes in order to connect the storage nodes to the bit lines; coupling a first control signal and a second control signal to the pass-gate devices in order to adjust drive strengths of the pass-gate devices, wherein the first control signal is routed in a direction orthogonal to a bit line direction, and the second control signal is routed in a direction same as the bit line direction; and coupling a third control signal to the pull-up devices in order to adjust drive strengths of the pull-up devices, wherein the third control signal is routed in a direction same as the bit line direction.

Yet another exemplary embodiment is directed to an SRAM cell comprising storage means for storing complementary binary values; bit line access means for transmitting the complementary binary values to/from the storage means; pull-up means for coupling the storage means to positive power supply voltage; pull-down means for coupling the storage means to negative power supply voltage; pass-gate means for coupling the storage means to the bit line access means; a first control means and a second control means for adjusting drive strengths of the pass-gate means, wherein the first control means is routed in a direction orthogonal to a bit line direction, and the second control means is routed in a direction same as the bit line direction; and a third control means for adjusting drive strengths of the pull-up means, wherein the third control means is routed in a direction same as the bit line direction.

Another exemplary embodiment is directed to a method of forming an SRAM cell comprising step for configuring a pair of storage nodes to store complementary binary values; step for coupling a pair of bit lines to the storage nodes to transmit the complementary binary values to/from the storage nodes; step for coupling a pair of pull-up devices to the storage nodes in order to connect the storage nodes to positive power supply voltage; step for coupling a pair of pull-down devices to the storage nodes in order to connect the storage nodes to negative power supply voltage; step for coupling a pair of pass-gate devices to the storage nodes in order to connect the storage nodes to the bit lines; step for coupling a first control signal and a second control signal to the pass-gate devices in order to adjust drive strengths of the pass-gate devices, wherein the first control signal is routed in a direction orthogonal to a bit line direction, and the second control signal is routed in a direction same as the bit line direction; and step for coupling a third control signal to the pull-up devices in order to adjust drive strengths of the pull-up devices, wherein the third control signal is routed in a direction same as the bit line direction.

BRIEF DESCRIPTION OF THE DRAWINGS

The accompanying drawings are presented to aid in the description of embodiments and are provided solely for illustration of the embodiments and not limitation thereof.

FIG. 10 illustrates a chart comparing RSNM, WNM and HSNM values of conventional TG-SRAMs, prior art designs according to Liu, and exemplary embodiments.

DETAILED DESCRIPTION

Aspects of the invention are disclosed in the following description and related drawings directed to specific embodiments. Alternate embodiments may be devised without departing from the scope of the invention. Additionally, well-known elements of the various embodiments will not be described in detail or will be omitted so as not to obscure the relevant details of the various embodiments.

The word "exemplary" is used herein to mean "serving as an example, instance, or illustration." Any embodiment described herein as "exemplary" is not necessarily to be construed as preferred or advantageous over other embodiments. Likewise, the term "embodiments" does not require that all embodiments include the discussed feature, advantage or mode of operation.

The terminology used herein is for the purpose of describing particular embodiments only and is not intended to be limiting of embodiments. As used herein, the singular forms "a", "an" and "the" are intended to include the plural forms as well, unless the context clearly indicates otherwise. It will be further understood that the terms "comprises", "comprising,", "includes" and/or "including", when used herein, specify the presence of stated features, integers, steps, operations, elements, and/or components, but do not preclude the presence or addition of one or more other features, integers, steps, operations, elements, components, and/or groups thereof.

Further, many embodiments are described in terms of sequences of actions to be performed by, for example, elements of a computing device. It will be recognized that various actions described herein can be performed by specific circuits (e.g., application specific integrated circuits (ASICs)), by program instructions being executed by one or more processors, or by a combination of both. Additionally, these sequence of actions described herein can be considered to be embodied entirely within any form of computer readable storage medium having stored therein a corresponding set of computer instructions that upon execution would cause an associated processor to perform the functionality described herein. Thus, the various aspects of the various embodiments may be embodied in a number of different forms, all of which have been contemplated to be within the scope of the claimed subject matter. In addition, for each of the embodiments described herein, the corresponding form of any such embodiments may be described herein as, for example, "logic configured to" perform the described action.

As described previously, prior art techniques such as Guo seek to improve RSNM by controlling the back gate of the PG circuits in an SRAM cell, but at the cost of reducing HSNM due to a lowered VDD-Cell voltage which is employed to keep WNM from deteriorating. Liu on the other hand, improves RSNM during read operations, but WNM is not improved. Accordingly, exemplary embodiments are directed to improved RSNM and WNM, while HSNM is substantially protected from degradation.

Figure 5:
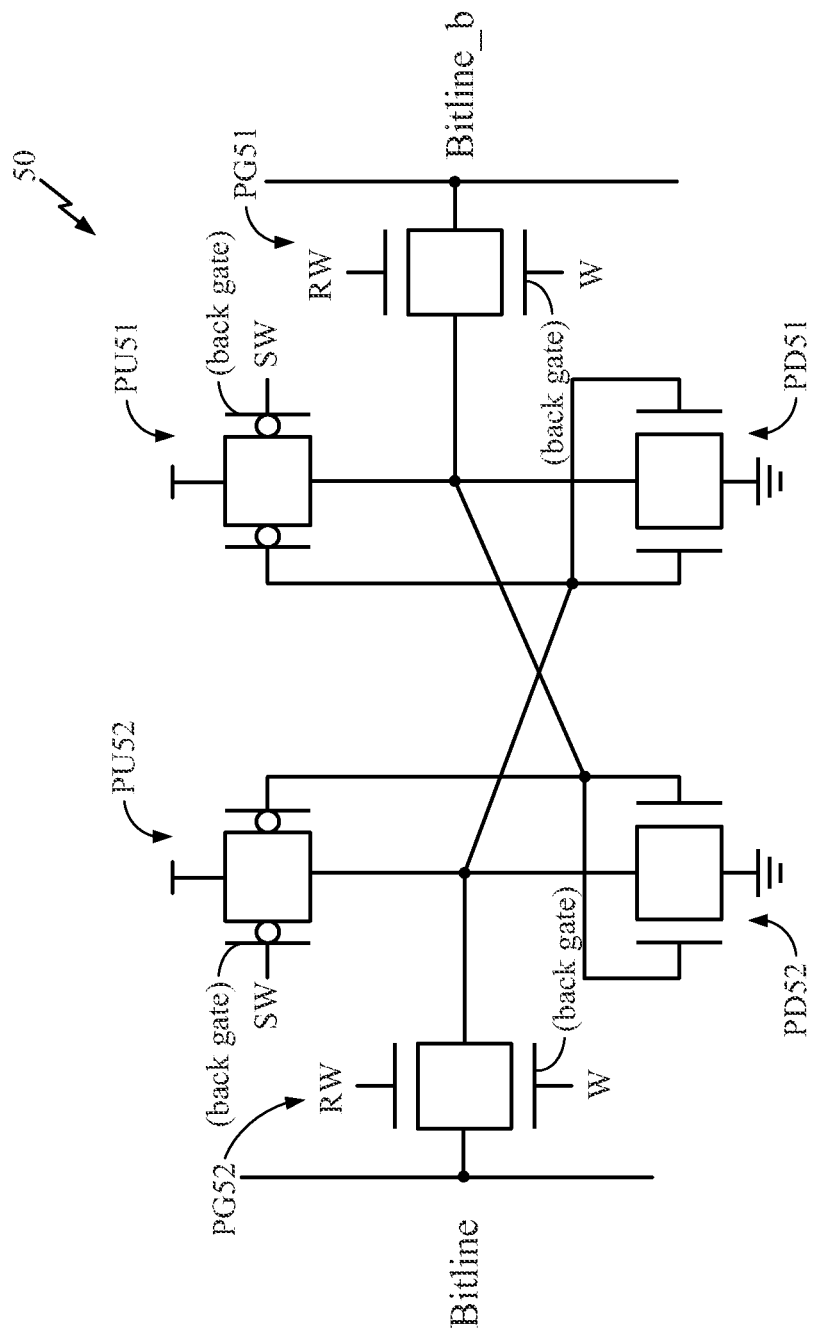
FIG. 5 illustrates an IG-FinFET SRAM cell according to an exemplary embodiment.

FIG. 5 illustrates an exemplary embodiment. As shown in FIG. 5, SRAM cell 50 comprises independently controllable PU, PD and PG circuits. Each of these circuits comprises a transistor pair formed by IG-FinFETs with independently controllable gates. The transistor pairs denoted PU52 and PD52 are electrically coupled to form an inverter, which is cross-coupled with another inverter formed by the transistor pairs PU51 and PD51. The pull up devices PU51 and PU52 are coupled to positive supply voltage, while the pull down devices PD51 and PD52 are coupled to ground or negative supply voltage. The output nodes of the cross-coupled inverters comprising PU51, PD51 and PU52, PD52 are coupled to pass gate devices PG51 and PG52 respectively. The pass gate devices PG51 and PG52 are coupled to bit lines denoted "Bitline" and "Bitline_b" respectively. Control signal "SW" controls the back gate potential of IG-FinFETs in PU devices PU51 and PU52. Signal SW is high during standby and write modes of operation.

Control signal "RW" controls the front gate potential of IG-FinFETs in PG devices PG51 and PG52. Control signal "W" controls the other transistors (back gates) of the two pairs. Signal RW is high during read and write operations, while signal W is high only during a write operation.

A write operation in SRAM 50 proceeds by driving all three signals, SW, RW and W, high. Driving SW high has the effect of turning off the back gate of IG-FinFET transistors of PU51 and PU52. Therefore the front gate is conducting during a write operation, and the PU strength of the cell is correspondingly reduced. On the other hand, both transistors of the PG devices PG51 and PG52 are conducting during a write. Accordingly, with the PG strength maintained at a high value, and PU strength lowered, the ratio $\alpha(=PG/PU)$ and correspondingly, the WNM of the circuit are increased. Thus, SRAM51 achieves a high WNM and improved writability in the write mode.

During a read operation, signal RW is high, while both SW and W are driven low. As a result, only front gate of PG51 and PG52 are "on," thereby reducing the strength of PG, while the strengths of PD and PU are not changed. Accordingly, $\beta(=PD/PG)$ increases, and correspondingly, the RSNM of the SRAM cell is also increased.

In standby mode, SW is high, while RW and W are maintained low. Therefore, the back gate of PU51 and PU52 is turned off, thereby decreasing the strength of PU. Because RW and W are low, the PG devices PG51 and PG52 are not conducting, and the SRAM storage element is isolated from the bit lines. Since the drive strength of PU is only slightly decreased, HSNM degradation is insignificant.

Figure 6:
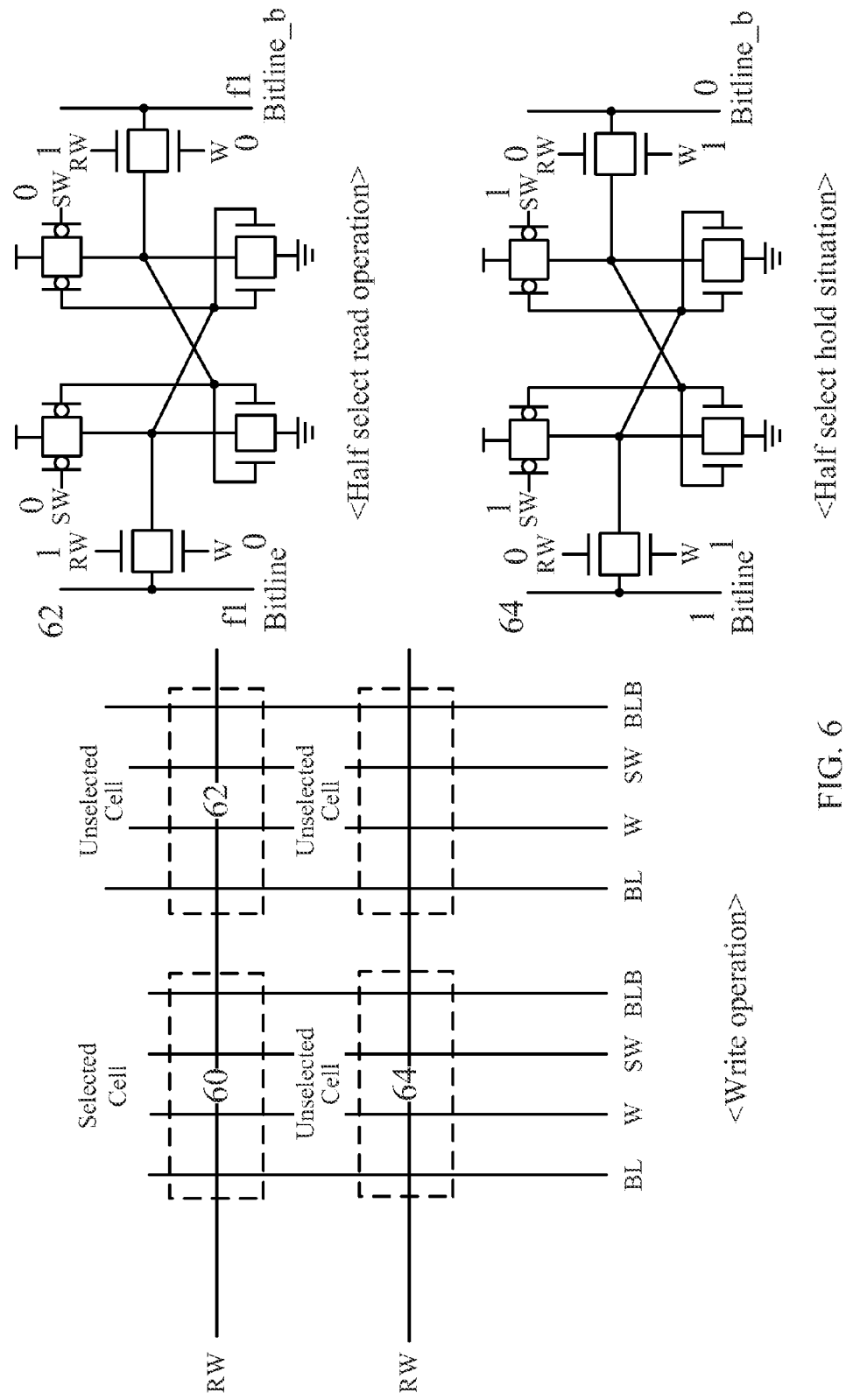
FIG. 6 illustrates an SRAM array comprising cells according to an exemplary embodiment, wherein half select issues are avoided.
Figure 7:
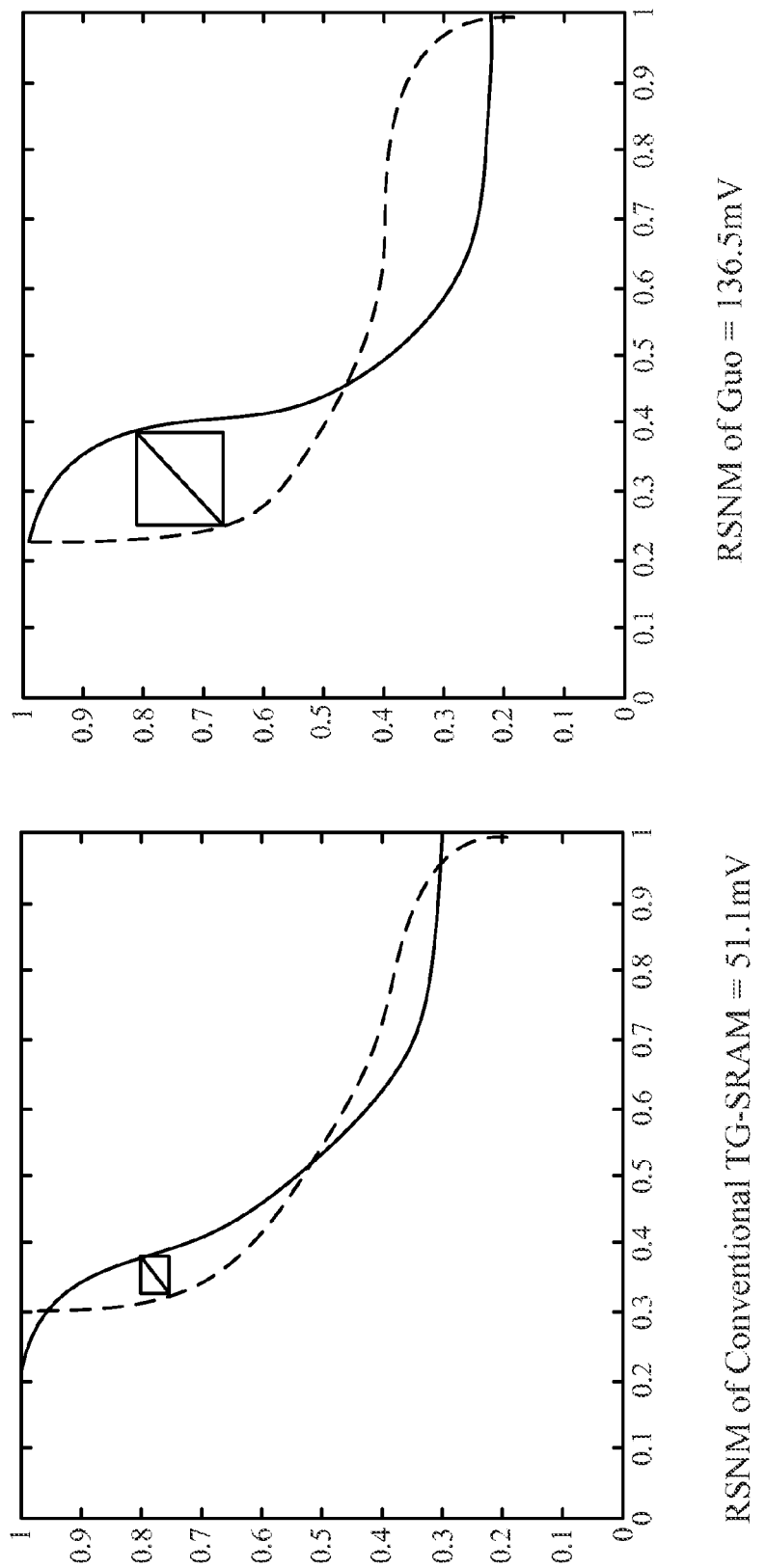
FIG. 7 illustrates BTCs for comparing RSNM values of conventional TG-SRAMs, and the SRAM cell according to Guo.
Figure 8:
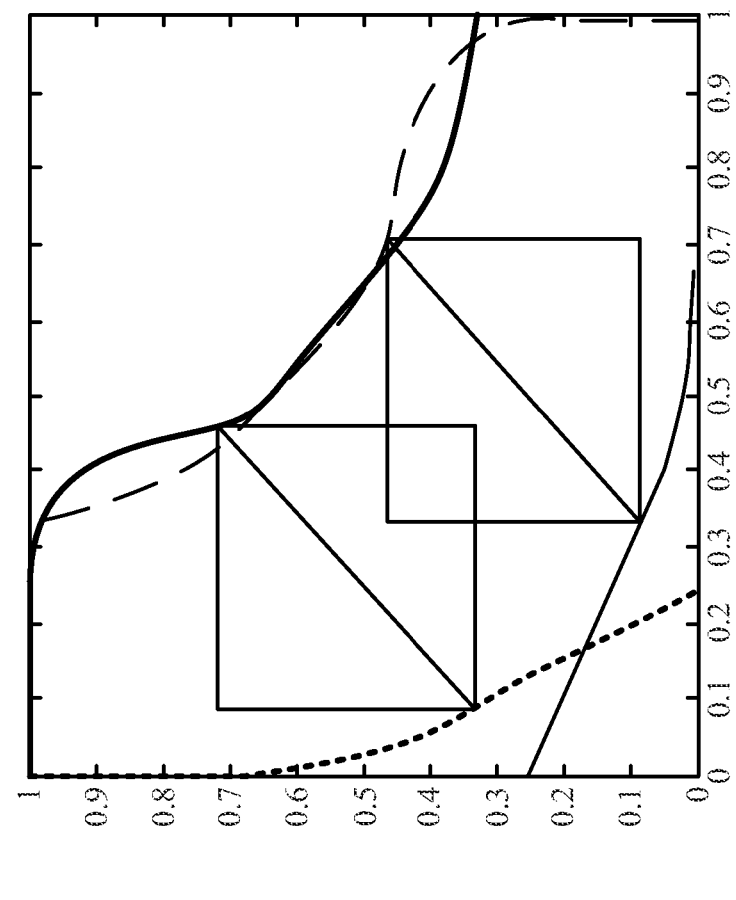
FIG. 8 illustrates BTCs for comparing WNM values of conventional TG-SRAMs, and the SRAM cell according to Guo.
Figure 8:
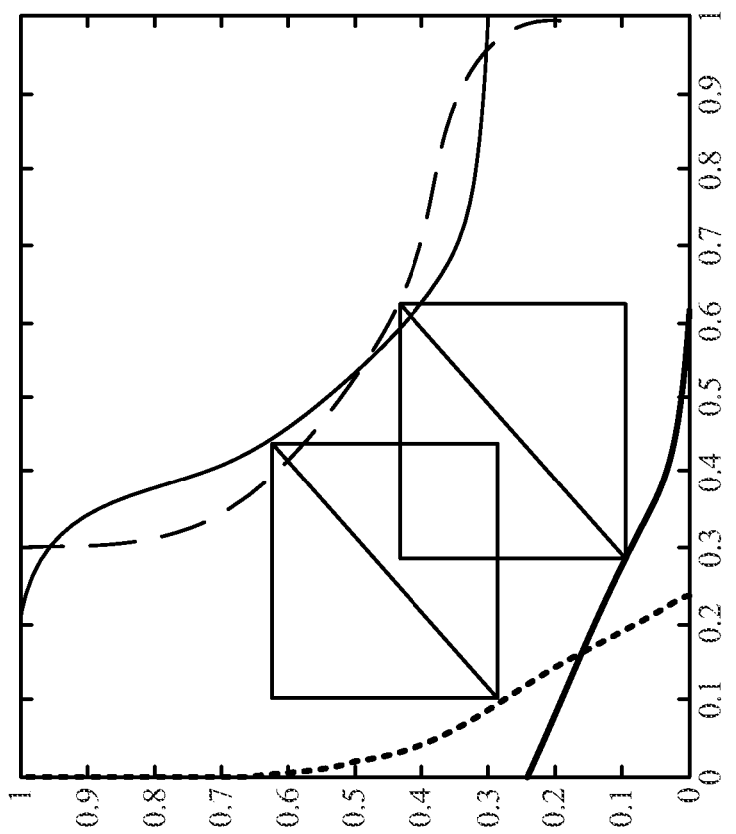
Figure 9:
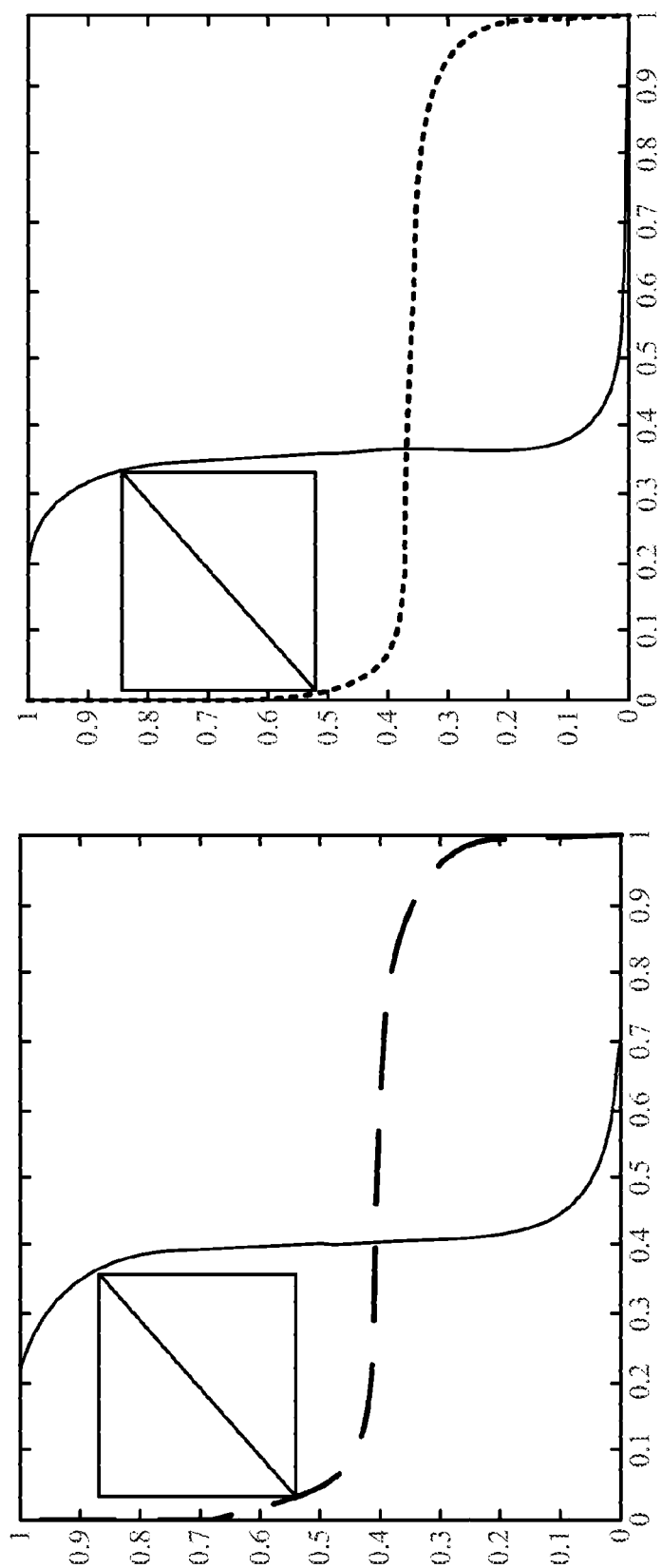
FIG. 9 illustrates BTCs for comparing HSNM values of conventional TG-SRAMs, and the SRAM cell according to Guo.

FIG. 6 illustrates an SRAM array comprising cells such as cell 50 of FIG. 5 according to an exemplary embodiment described in the foregoing sections. Bit lines denoted "bitline" and "bitline_b", and abbreviated as BL and BLB, respectively, as illustrated are disposed in a vertical direction. Control signals SW and W are routed in the same direction as the bit lines, henceforth referred to as the "vertical" direction. Control signal RW is routed in a direction orthogonal to the bit lines, henceforth referred to as the "horizontal" direction. SRAM cell 60 is a selected cell during an exemplary write operation. Cell 62 is horizontally selected and vertically unselected, and cell 64 is vertically selected and horizontally unselected. Cells 62 and 64 are called "half selected cells". Cell 62 operates in read mode of operation, "half select read operation" and Cell 64 is in hold situation, "half select hold situation." Binary values "0" and "1" are indicated during read and write operations. The value "f1" refers to a floating voltage value of "1" and "D, D'," are used to indicate complementary data values. Exemplary embodiments advantageously avoid problems associated with half selected cells by routing control signals SW and W vertically.

Focusing on cell 62, for the half select read operation, the bit lines are floating (i.e. BL=f1 and BLB=f1), since the column to which the cell belongs, is not selected. Signal RW is routed horizontally as previously described, and therefore RW is driven high for both selected cell 60 and half selected cell 62 during the write operation. However, signals SW and W are maintained low for cell 62 (i.e. W=0 and SW=0), because the cell 62 is not in a selected column. While existing techniques would have subjected cell 62 to a half select read problem, exemplary embodiments avoid this issue. Because SW and W are low, and only RW is high, the strengths of the PG devices of cell 62 are reduced. Accordingly, $\alpha$ is low and therefore RSNM of cell 62 is a high value. In other words, the cell is stable during a read operation, and false read operations are prevented.

For cell 64, in a half select hold situation, SW and W are high (i.e. W=1 and SW=1), since they are vertically driven and the cell is in a selected column, but RW is low. Therefore only the back gate of each PG device is slightly conducting and the p-channel PU devices are also slightly weakened. However, the current flowing through PG device is negligible in this case, and the slightly weakened PU device has an insignificant effect on HSNM. Thus, the unselected cell 64 is prevented from being affected by half select problems in exemplary embodiments.

In summary, exemplary embodiments described above, improve WNM and RSNM without the HSNM of the circuit suffering deterioration. A comparison of all three SNM parameters: RSNM, WNM and HSNM between the SRAM circuits of Liu, and exemplary embodiments of SRAM cell 50 is illustrated in the table of FIG. 10.

In FIG. 10, Liu has two different entries (RSNM1 and RSNM2) for RSNM while Cell 50 has three different entries (HSNM1, HSNM2, and HSNM3) for HSNM. The signal "SW" is high in both stand-by mode and write operation. Thus, during write operation, back gate of PU is turned off while PG is fully turned on. Due to weakened driving strength of PU, the $\alpha$ ratio is increased and thus WNM of Cell 50 is improved compared to that of conventional TG-SRAMs and Liu.

During a read operation, PG operates in the same way as Liu. On the other hand, SW is low and thus the back gates of both PUs are turned on, causing leakage current through one PU whose only back gate is turned. However, the leakage current is negligible, which does not disturb normal read operation. Thus, RSNM of Cell 50 is comparable to RSNM1 of Liu.

During stand-by mode, SW is high and thus back gate of PU is turned off. Due to weakened driving strength of PU, hold static noise margin (HSNM) of Cell 50 is slightly degraded compared to that of a conventional TG-SRAM. However, HSNM degradation is negligible as described below.

Figure 1:
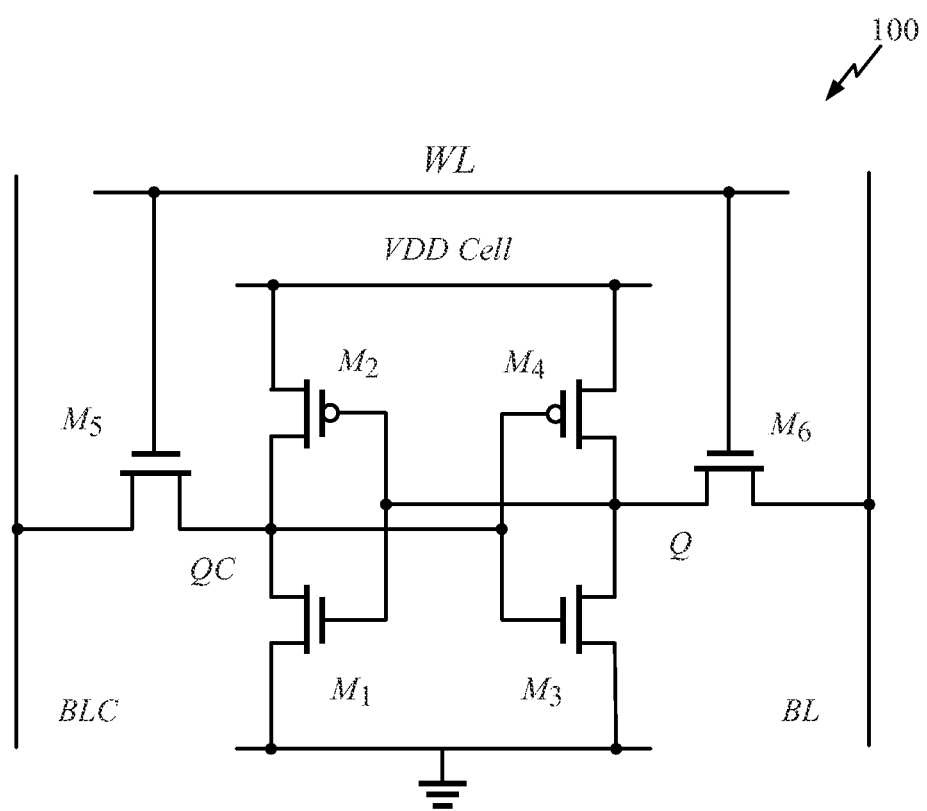
FIG. 1 illustrates a conventional SRAM cell.
Figure 2A:
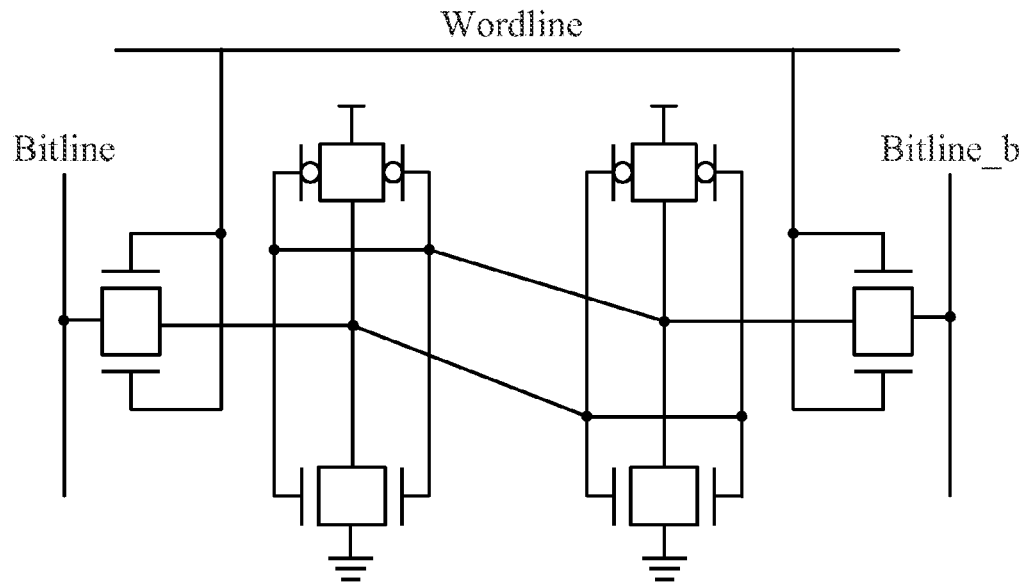
FIG. 2A illustrates a conventional TG-SRAM cell.
Figure 2B:
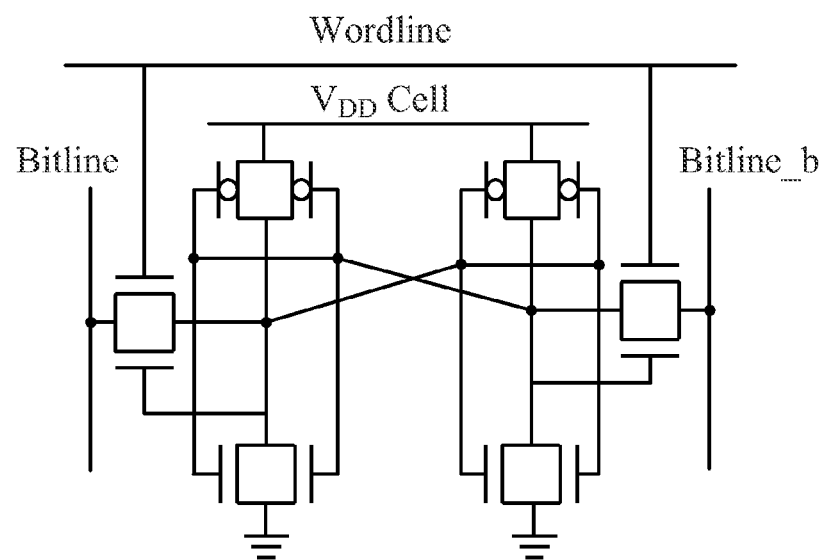
FIG. 2B illustrates an SRAM cell according to prior art Guo.
Figure 3:
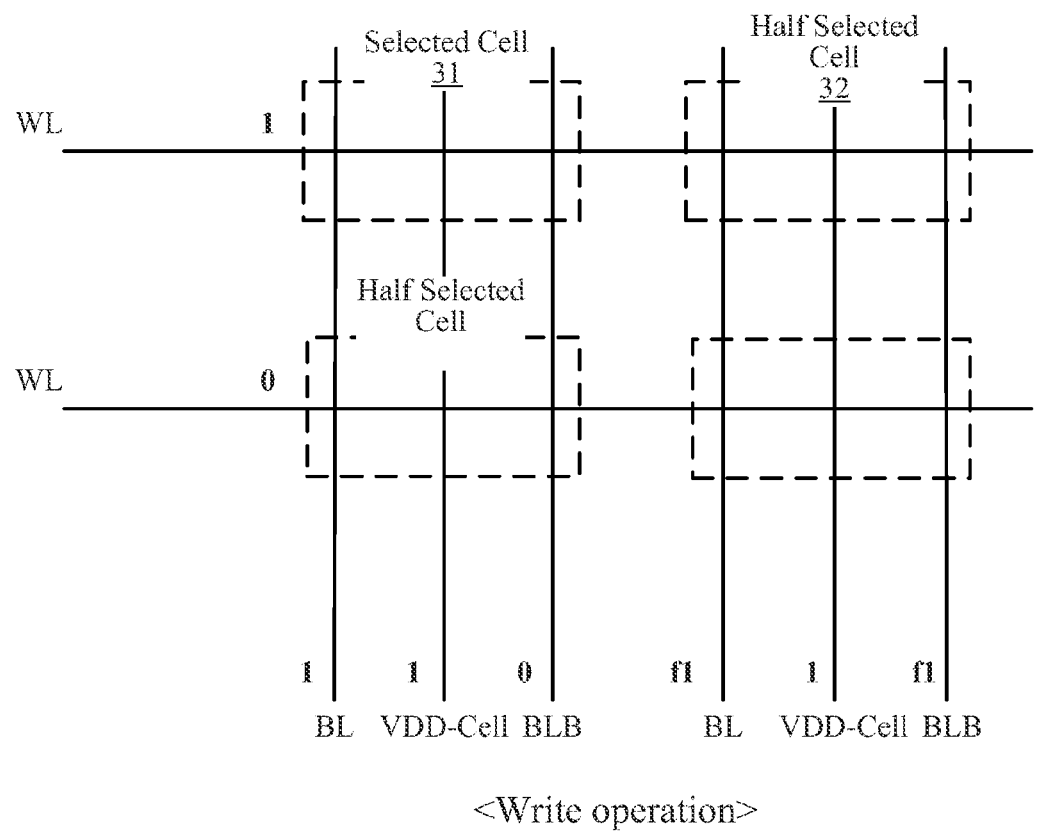
FIG. 3 illustrates an SRAM array according to prior art Guo.
Figure 4:
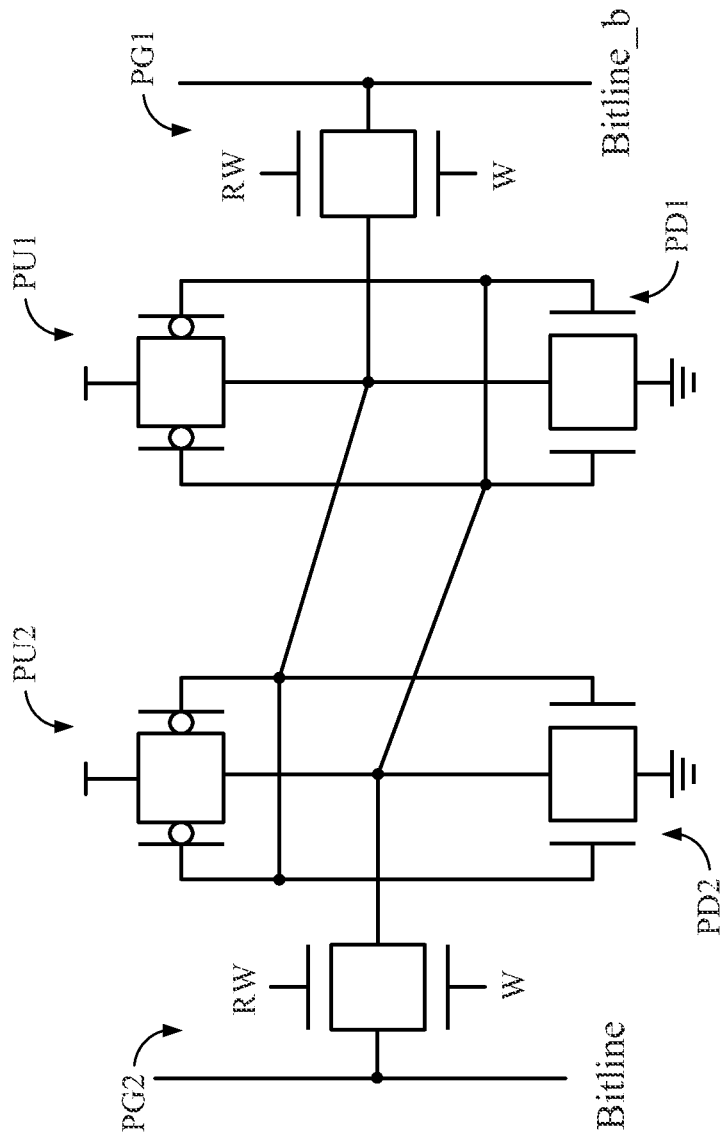
FIG. 4 illustrates an IG-FinFET SRAM cell design according to prior art Liu.
Figure 11:
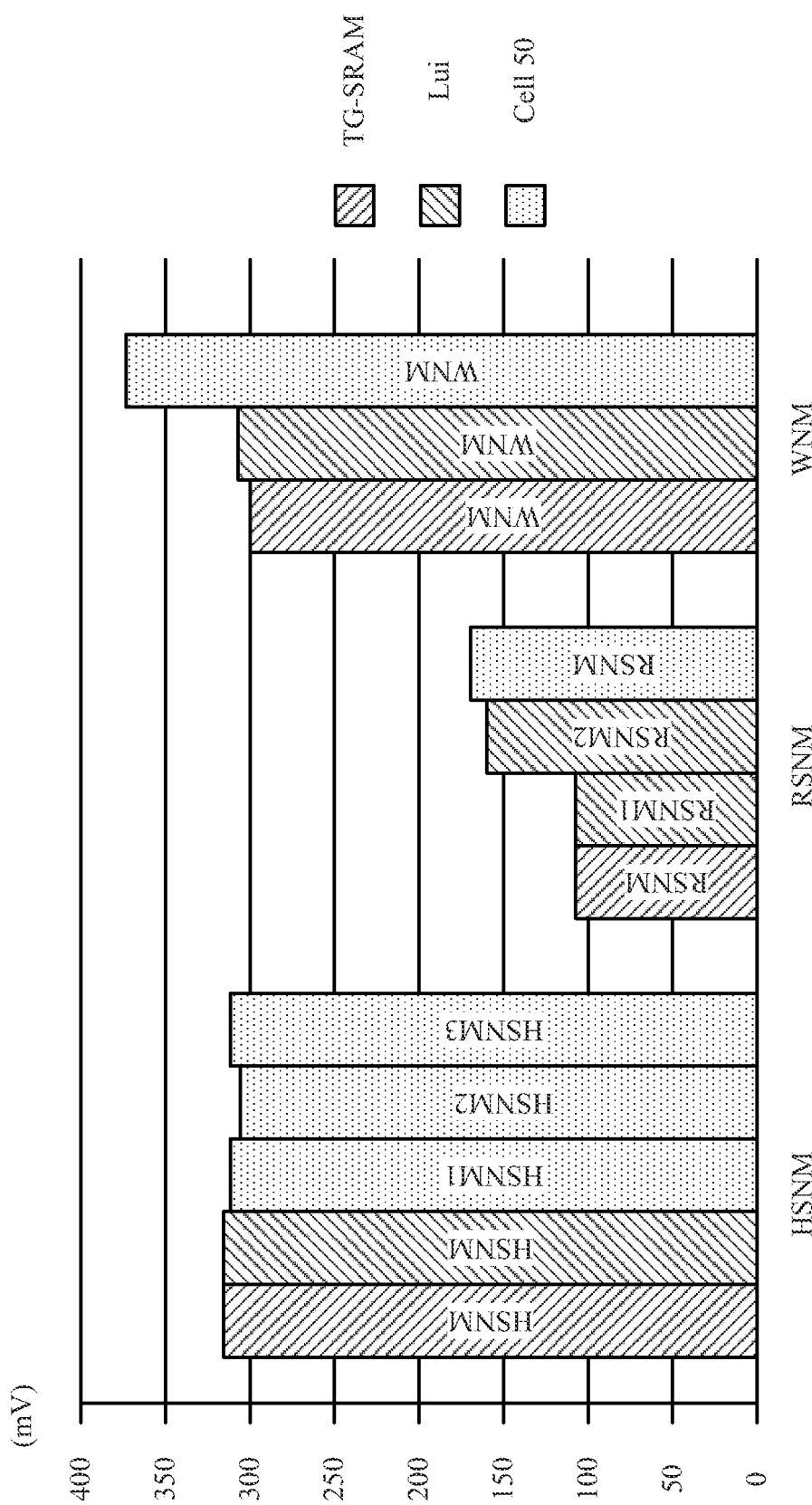
FIG. 11 illustrates a bar graph of the values shown in the table of FIG. 10.

All the cells are classified into 4 different cases, selected cell (SLC), horizontally selected and vertically half selected cell (HSLC 1), vertically selected and horizontally half selected cell (HSLC 2), and unselected cell (USLC) as shown in FIG. 10. The signals (RW, W, and SW) for cell 50 (e.g. as shown in FIG. 5) are each selected from a low voltage or logic value "0" or high voltage or logic value "1" as shown in FIG. 10 for each of the above 4 cells, for the standby, read, and write modes of operation. The corresponding values of RSNM, HSNM1, HSNM2, HSNM3, and WNM are illustrated in FIG. 11 for cell 50. Similarly, the values of RSNM1, RSNM2, HSNM, and WNM are selected for the cell of Liu (e.g. as shown in FIG. 4) are each selected from the values 0 or 1 as shown in FIG. 10 for each of the above 4 cells, for standby, read, and write modes of operation. The corresponding values of RSNM1, RSNM2, HSNM, and WNM are illustrated in FIG. 11 for Liu. FIG. 11 also illustrates HSNM, RSNM, and WNM values for a TG-SRAM computed in a similar manner as shown above for cell 50 and Liu in FIG. 10. In contrast to Liu, with combined reference to FIGS. 10 and 11, it is seen that for cell 50, W is disposed vertically and is high only if BL is selected. Since W is low for HSLC 1 (Cell 62), RSNM for HSLC 1 (Cell 62) during a write operation is the same as RSNM during a read operation. Thus, Cell 50 does not suffer from RSNM degradation for HSLC 1 during write operation. During read and write operations, stabilities of HSLC 2 and USLC are evaluated by HSNM since PG is completely turned off or half turned on by the back gate. HSNM2 for USLC during read and write operations and HSNM3 for HSLC 2 during a write operation are almost same as HSNM1 during stand-by mode. These results are also illustrated in the graph of FIG. 11. Accordingly, the exemplary embodiments accomplish stability and high noise margins during read, write and standby modes of operation.

Figure 12:
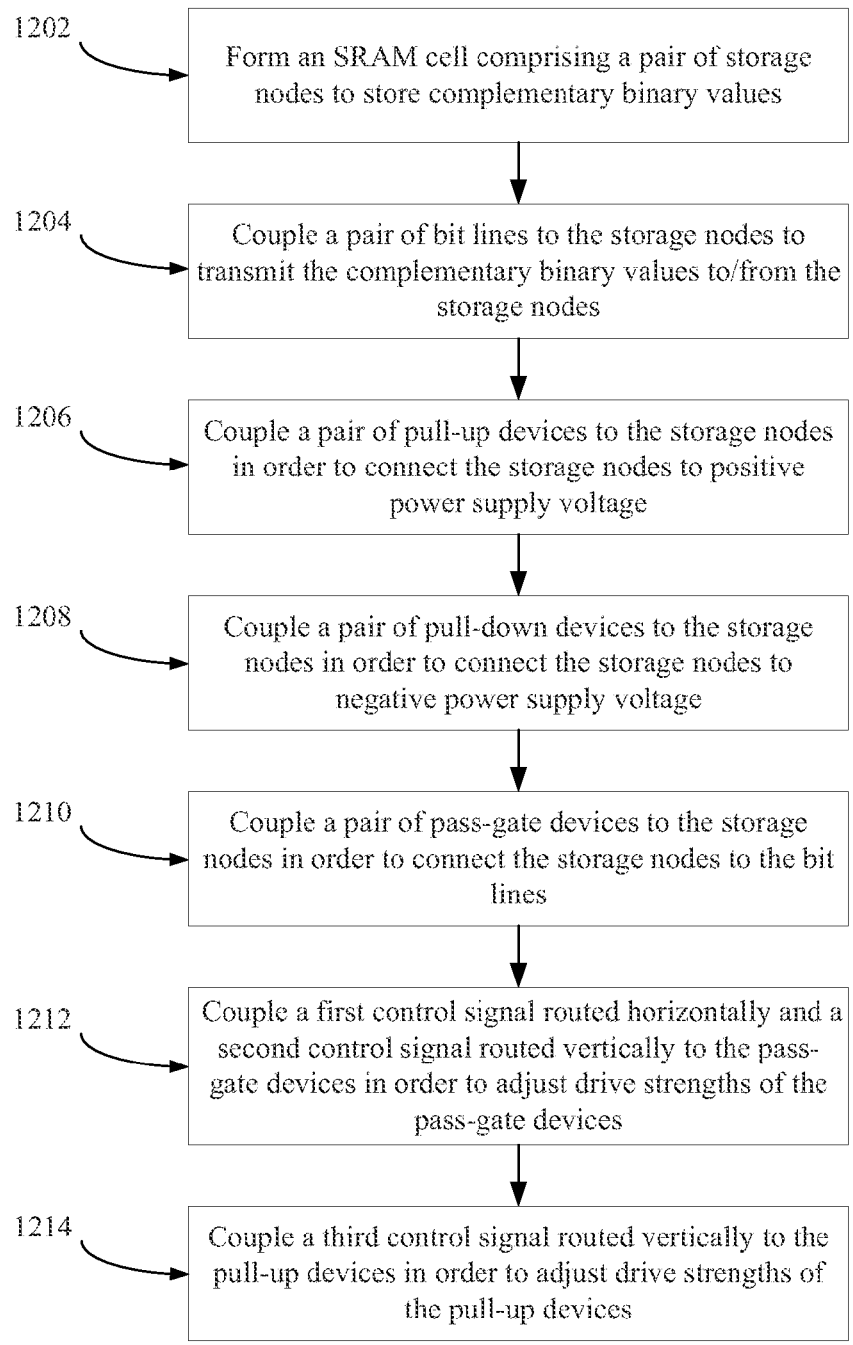
FIG. 12 is a flow chart illustrating a method of forming an SRAM cell according to an exemplary embodiment.

It will be appreciated that embodiments include various methods for performing the processes, functions and/or algorithms disclosed herein. For example, as illustrated in FIG. 12, an embodiment can include a method of forming an SRAM cell comprising configuring a pair of storage nodes to store complementary binary values (block 1202). Next, at block 1204, couple a pair of bit lines to the storage nodes to transmit the complementary binary values to/from the storage nodes. At block 1206, couple a pair of pull-up devices to the storage nodes in order to connect the storage nodes to positive power supply voltage. Proceeding to block 1208, couple a pair of pull-down devices to the storage nodes in order to connect the storage nodes to negative power supply voltage, and at block 1210, couple a pair of pass-gate devices to the storage nodes in order to connect the storage nodes to the bit lines. Next, at block 1212, couple a first control signal and a second control signal to the pass-gate devices in order to adjust drive strengths of the pass-gate devices, wherein the first control signal is routed horizontally, and the second control signal is routed vertically. Finally, at block 1214, couple a third control signal to the pull-up devices in order to adjust drive strengths of the pull-up devices, wherein the third control signal is routed vertically.

Those of skill in the art will appreciate that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

Further, those of skill in the art will appreciate that the various illustrative logical blocks, modules, circuits, and algorithm steps described in connection with the embodiments disclosed herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the invention.

The methods, sequences and/or algorithms described in connection with the embodiments disclosed herein may be embodied directly in hardware, in a software module executed by a processor, or in a combination of the two. A software module may reside in RAM memory, flash memory, ROM memory, EPROM memory, EEPROM memory, registers, hard disk, a removable disk, a CD-ROM, or any other form of storage medium known in the art. An exemplary storage medium is coupled to the processor such that the processor can read information from, and write information to, the storage medium. In the alternative, the storage medium may be integral to the processor.

Accordingly, an embodiment can include a computer readable media embodying a method for utilizing (IG-FinFET) architectures in highly stable SRAM architectures. Accordingly, the various embodiments are not limited to illustrated examples and any means for performing the functionality described herein are included in embodiments.

Embodiments of the disclosure may be suitably employed in any device which includes active integrated circuitry including memory and on-chip circuitry for test and characterization.

The foregoing disclosed devices and methods are typically designed and are configured into GDSII and GERBER computer files, stored on a computer readable media. These files are in turn provided to fabrication handlers who fabricate devices based on these files. The resulting products are semiconductor wafers that are then cut into semiconductor die and packaged into a semiconductor chip. The chips are then employed in devices described above.

While the foregoing disclosure shows illustrative embodiments, it should be noted that various changes and modifications could be made herein without departing from the scope of the invention as defined by the appended claims. The functions, steps and/or actions of the method claims in accordance with the embodiments described herein need not be performed in any particular order. Furthermore, although elements of the various embodiments may be described or claimed in the singular, the plural is contemplated unless limitation to the singular is explicitly stated.

What is claimed is:

1. A static random access memory (SRAM) cell comprising:
  pull-down devices configured to couple storage nodes to a negative power supply, wherein a back gate of a first pull-down device of the pull-down devices and a front gate of the first pull-down device are configured to receive a common input;
  pass-gate devices configured to couple the storage nodes to bit lines, wherein a front gate of each pass-gate device of the pass-gate devices is configured to receive a first control signal, wherein a back gate of each pass-gate device of the pass-gate devices is configured to receive a second control signal, and wherein a first drive strength of the pass-gate devices is based on the first control signal and the second control signal; and
  pull-up devices configured to couple the storage nodes to a positive power supply, wherein a back gate of each pull-up device of the pull-up devices is configured to receive a third control signal, wherein a second drive strength of the pull-up devices is based on the third control signal, and wherein the common input, the first control signal, the second control signal, and the third control signal are different signals, wherein the SRAM cell is included in an array of SRAM cells of a memory device, wherein the first control signal is routed across the array of SRAM cells in a first direction substantially orthogonal to a bit line direction, and wherein the second and third control signals are routed across the array of SRAM cells in a second direction substantially orthogonal to the first direction.

2. The SRAM cell of claim 1, wherein the pass-gate devices comprise a first pair of independent-gate fin field-effect transistor (IG-FinFET) devices, wherein the pull-up devices comprise a second pair of IG-FinFET devices, and wherein the pull-down devices comprise a third pair of IG-FinFET devices.

3. The SRAM cell of claim 1, wherein the first control signal is maintained at a first high voltage state during a read operation and during a write operation associated with the storage nodes, wherein the second control signal is maintained at a second high voltage state during the write operation, and wherein the third control signal is maintained at a third high voltage state during a standby mode and during the write operation.

4. The SRAM cell of claim 1, wherein, during a read operation associated with the storage nodes, the first drive strength is reduced from an initial first drive strength value, and wherein a read static noise margin parameter is increased based on the reduced first drive strength.

5. The SRAM cell of claim 1, wherein, during a write operation associated with the storage nodes, the second drive strength is reduced from an initial second drive strength value, and wherein a write noise margin parameter is increased based on the reduced second drive strength.

6. The SRAM cell of claim 1, wherein the pull-up devices, the pull-down devices, and the pass-gate devices are integrated in at least one semiconductor die.

7. The SRAM cell of claim 1, wherein the storage nodes, the bit lines, the pull-up devices, the pull-down devices, and the pass-gate devices are included in a computer, a communications device, a set top box, a music player, a video player, an entertainment unit, a navigation device, a personal digital assistant (PDA), a fixed location data unit, or a combination thereof.

8. The SRAM cell of claim 1, wherein the bit lines are configured to transmit complementary binary values to the storage nodes or to receive the complementary binary values from the storage nodes.

9. The SRAM cell of claim 1, wherein, during a half-select hold operation of the storage nodes, the first control signal is maintained at a first low voltage state, the second control signal is maintained at a first high voltage state, and the third control signal is maintained at a second high voltage state.

10. The SRAM cell of claim 9, wherein the second drive strength is reduced from an initial second drive strength value during the half-select hold operation.

11. The SRAM cell of claim 1, wherein the first drive strength is reduced from an initial first drive strength value during a half-select read operation of the storage nodes.

12. The SRAM cell of claim 1, wherein, during a half-select read operation of the storage nodes, the first control signal is maintained at a first high voltage state, the second control signal is maintained at a first low voltage state, and the third control signal is maintained at a second low voltage state.

13. The SRAM cell of claim 1, wherein, during a standby mode of the storage nodes, the first control signal is maintained in a first low voltage state, the second control signal is maintained in a second low voltage state, and the third control signal is maintained in a first high voltage state.

14. The SRAM cell of claim 1, wherein the pass-gate devices include a first pass-gate device and a second pass-gate device, wherein the pull-up devices includes a first pull-up device and a second pull-up device, wherein a back gate of the first pass-gate device and a back gate of the first pull-up device receive different control signals, and wherein a back gate of the second pass-gate device and a back gate of the second pull-up device receive different control signals.

15. The SRAM cell of claim 14, wherein the back gate of the first pass-gate device and the back gate of the second pass-gate device are controlled independent of the third control signal, and wherein the back gate of the first pull-up device and the back gate of the second pull-up device are controlled independent of the second control signal.

16. The SRAM cell of claim 1, wherein the third control signal comprises a high voltage state during a half-select hold operation and during a standby mode, and wherein the third control signal comprises a low voltage state during a half-select read operation.

17. A method comprising:
providing a first control signal and a second control signal to pass-gate devices that couple storage nodes to bit lines, wherein the first control signal is provided to a front gate of each pass-gate device of the pass-gate devices, and wherein the second control signal is provided to a back gate of each pass-gate device of the pass-gate devices; and
providing a third control signal to pull-up devices that couple the storage nodes to a positive power supply, wherein the third control signal is provided to a back gate of each of the pull-up devices, wherein a front gate and a back gate of a pull-down device configured to couple a first storage node of the storage nodes to a negative power supply are configured to receive a common input, and wherein the common input, the first control signal, the second control signal, and the third control signal are different signals, wherein the first control signal is routed across an array of SRAM cells of a memory device in a first direction substantially orthogonal to a bit line direction, and wherein the second and third control signals are routed across the array of SRAM cells in a second direction substantially orthogonal to the first direction.

18. The method of claim 17, wherein the pass-gate devices comprise a first pair of independent-gate fin field-effect transistor (IG-FinFET) devices, and wherein the pull-up devices comprise a second pair of IG-FinFET devices.

19. The method of claim 17, further comprising, during a read operation of the storage nodes, maintaining the first control signal in a first high voltage state, maintaining the second control signal in a first low voltage state, and maintaining the third control signal in a second low voltage state.

20. The method of claim 17, wherein a first drive strength of the pass-gate devices is based on the first control signal and the second control signal, and further comprising reducing the first drive strength during a read operation of the storage nodes, wherein a read static noise margin parameter is increased based on the reduced first drive strength.

21. The method of claim 17, wherein a second drive strength of the pull-up devices is based on the third control signal, and further comprising reducing the second drive strength during a write operation of the storage nodes, wherein a write noise margin parameter is increased based on the reduced second drive strength.

22. The method of claim 7, wherein a first drive strength of the pass-gate devices is based on the first control signal and the second control signal, and wherein a second drive strength of the pull-up devices is based on the third control signal.

23. A static random access memory (SRAM) cell comprising:
means for storing data;
means for coupling the means for storing to a negative power supply, wherein the means for coupling the means for storing to the negative power supply includes a first means for gating and a second means for gating that are configured to receive a common input;
means for accessing the means for storing, wherein the means for accessing includes a third means for gating and a fourth means for gating, wherein the third means for gating is configured to receive a first control signal, wherein the fourth means for gating is configured to receive a second control signal, and wherein a first drive strength of the means for accessing is based on the first control signal and the second control signal; and
means for coupling the means for storing data to a positive power supply, wherein the means for coupling the means for storing data to the positive power supply includes a fifth means for gating, wherein the fifth means for gating is configured to receive a third control signal, wherein a second drive strength of the means for coupling the means for storing data to the positive power supply is based on the third control signal, and wherein the common input, the first control signal, the second control signal, and the third control signal are different signals, wherein the SRAM cell is included in an array of SRAM cells of a memory device, wherein the first control signal is routed across the array of SRAM cells in a first direction, and wherein the second and third control signals are routed across the array of SRAM cells in a second direction substantially orthogonal to the first direction.

24. The SRAM cell of claim 23, wherein during a read operation of the means for storing, the first drive strength is reduced from an initial first drive strength value, wherein a read static noise margin parameter is increased based on the reduced first drive strength during the read operation, wherein during a write operation the second drive strength is reduced from an initial second drive strength value, and wherein a write noise margin parameter is increased based on the reduced second drive strength during the write operation.

25. The SRAM cell of claim 23, wherein:
the means for storing corresponds to a storage node;
the means for coupling the means for storing to the negative power supply corresponds to a pull-down device;
the means for accessing the means for storing corresponds to a pass-gate device;
the first means for gating correspond to a front gate of the pass-gate device;
the second means for gating corresponds to a back gate of the pass-gate device;
the means for coupling the means for storage to the positive power supply corresponds to a pull-up device; and
the third means for gating corresponds to a back gate of the pull-up device.

26. A method comprising:
a first step for coupling pull-up devices to storage nodes of a memory cell of a memory array, wherein the pull-up devices are configured to couple the storage nodes to a positive power supply;
a second step for coupling pull-down devices to the storage nodes, wherein the pull-down devices are configured to couple the storage nodes to a negative power supply, and wherein a back gate of a first pull-down device of the pull-down devices and a front gate of the first pull-down device are configured to receive a common input line configured to receive a common signal;
a third step for coupling pass-gate devices to the storage nodes, wherein the pass-gate devices are configured to couple the storage nodes to bit lines;
a fourth step for coupling a first line associated with a first control signal and a second line associated with a second control signal to the pass-gate devices, wherein the first line is coupled to a front gate of each pass-gate device of the pass-gate devices, wherein the second line is coupled to a back gate of each pass-gate device of the pass-gate devices, and wherein a first drive strength of the pass-gate devices is based on the first control signal and the second control signal; and
a fifth step for coupling a third line associated with a third control signal to a back gate of each pull-up device of the pull-up devices, wherein the common input, the first control signal, the second control signal, and the third control signal are different signals, and wherein a second drive strength of the pull-up devices is based on the third control signal, wherein the first control signal is routed across the memory array in a first direction substantially orthogonal to a bit line direction, and wherein the second and third control signals are routed across the memory array in a second direction substantially orthogonal to the first direction.

27. The method of claim 26, wherein the first step, the second step, the third step, the fourth step, and the fifth step are performed by a fabrication handler, wherein the fabrication handler is configured to perform the first step, the second step, the third step, the fourth step, and the fifth step based on instructions stored on a non-transitory computer readable medium.

28. A non-transitory computer readable storage device comprising instructions that, when executed by a processor, cause the processor to:
access a data value from a memory cell, the memory cell comprising:
pull-down devices configured to couple storage nodes to a negative power supply, wherein a back gate of a first pull-down device of the pull-down devices and a front gate of the first pull-down device are coupled to a common input line configured to receive a common input;
pass-gate devices configured to couple the storage nodes to bit lines, wherein a front gate of each pass-gate device of the pass-gate devices is configured to receive a first control signal, wherein a back gate of each pass-gate device of the pass-gate devices is configured to receive a second control signal, and wherein a first drive strength of the pass-gate devices is based on the first control signal and the second control signal; and
pull-up devices configured to couple the storage nodes to a positive power supply,
wherein a back gate of each pull-up device of the pull-up devices is configured to receive a third control signal, and wherein a second drive strength of the pull-up devices is based on the third control signal, and wherein the common input, the first control signal, the second control signal, and the third control signal are different signals, wherein the memory cell is included in an array of memory cells of a memory device, wherein the first control signal is routed across the array of memory cells in a first direction substantially orthogonal to a bit line direction, and wherein the second and third control signals are routed across the array of memory cells in a second direction substantially orthogonal to the first direction; and write a second data value to the memory cell.

29. A memory array comprising:

a plurality of static random access memory (SRAM) cells, wherein each SRAM cell of the plurality of SRAM cells comprises:

a first pull-down device and a second pull-down device, wherein the first pull-down device is configured to couple a first storage node to a negative power supply, and wherein the second pull-down device is configured to couple a second storage node to the negative power supply;

a first pull-up device and a second pull-up device, wherein the first pull-up device is configured to couple the first storage node to a positive power supply, and wherein the second pull-up device is configured to couple the second storage node to the positive power supply; and a first pass-gate device and a second pass-gate device, wherein the first pass-gate device is configured to couple the first storage node to a first bit line, and wherein the second pass-gate device is configured to couple the second storage node to a second bit line, wherein a first back gate of the first pull-down device and a first front gate of the first pull-down device are configured to receive a common input, wherein a second front gate of the first pass-gate device and a third front gate of the second pass-gate device are configured to receive a first control signal, wherein a second back gate of the first pass-gate device and a third back gate of the second pass-gate device are configured to receive a second control signal, wherein a fourth back gate of the first pull-up device and a fifth back gate of the second pull-up device are configured to receive a third control signal, wherein first drive strengths of the first pass-gate device and the second pass-gate device are based on the first control signal and the second control signal, wherein second drive strengths of the first pull-up device and the second pull-up device are based on the third control signal, and wherein the common input, the first control signal, the second control signal, and the third control signal are different signals, and wherein the plurality of SRAM cells correspond to an array of SRAM cells, wherein the first control signal is routed across the array of SRAM cells in a first direction, and wherein the first bit line, the second bit line, the second control signal, and the third control signal are routed across the array of SRAM cells in a second direction that is substantially orthogonal to the first direction.

30. The memory array of claim 29, wherein a particular SRAM cell of the plurality of SRAM cells has a first half-select static noise margin (HSNM) value at a first time, a second HSNM value at a second time, and a third HSNM value at a third time, and wherein the first HSNM value, the second HSNM value, and the third HSNM value are different HSNM values.

31. The memory array of claim 30, wherein the first time corresponds to a standby mode of a second particular SRAM cell, wherein the second time corresponds to a selection write operation of the second particular SRAM cell, and wherein the third time corresponds to a write operation of a third particular SRAM cell.

32. The memory array of claim 30, wherein the first time corresponds to a standby mode of a selected SRAM cell, wherein the second time corresponds to a read operation of the selected SRAM cell, and wherein the third time corresponds to a write operation of the selected SRAM cell.

* * * * *